(12) United States Patent
Beutler et al.

(10) Patent No.: US 10,663,327 B2
(45) Date of Patent: May 26, 2020

(54) MAGNETOSTRICTIVE PATH MEASURING APPARATUS AND METHOD OF MANUFACTURING A MEASURING PROBE OF A MAGNETOSTRICTIVE PATH MEASURING APPARATUS

(71) Applicant: BALLUFF GmbH, Neuhausen (DE)

(72) Inventors: Torsten Beutler, Ostfildern (DE); Roland Holder, Dettingen Teck (DE)

(73) Assignee: BALLUFF GmbH, Neuhausen (DE)

( * ) Notice: Subject to any disclaimer, the term of this patent is extended or adjusted under 35 U.S.C. 154(b) by 318 days.

(21) Appl. No.: 15/666,721

(22) Filed: Aug. 2, 2017

(65) Prior Publication Data

US 2018/0052016 A1 Feb. 22, 2018

(30) Foreign Application Priority Data

Aug. 5, 2016 (DE) .......... 10 2016 114 561

(51) Int. Cl.
| | |
|---|---|
| *G01B 7/14* | (2006.01) |
| *G01B 7/30* | (2006.01) |
| *G01R 33/02* | (2006.01) |
| *G01D 5/48* | (2006.01) |
| *G01D 5/14* | (2006.01) |

(Continued)

(52) U.S. Cl.
CPC ............ *G01D 5/485* (2013.01); *G01B 7/003* (2013.01); *G01B 7/14* (2013.01); *G01B 7/30* (2013.01); *G01B 11/26* (2013.01); *G01D 5/12* (2013.01); *G01D 5/14* (2013.01); *G01D 5/145* (2013.01); *G01D 5/147* (2013.01); *G01R 33/0041* (2013.01); *G01R 33/02* (2013.01); *G01R 33/07* (2013.01); *G01R 33/072* (2013.01)

(58) Field of Classification Search
CPC .......... G01D 5/145; G01D 5/14; G01D 5/147; G01D 5/12; G01B 7/003; G01B 7/14; G01B 7/30; G01B 11/26; G01R 33/07; G01R 33/02; G01R 33/072; G01R 33/0047

See application file for complete search history.

(56) References Cited

U.S. PATENT DOCUMENTS

| | | |
|---|---|---|
| 4,121,155 A | 10/1978 | Chamuel |
| 4,634,973 A | 1/1987 | Murakami et al. |

(Continued)

FOREIGN PATENT DOCUMENTS

| | | |
|---|---|---|
| CN | 101788259 | 7/2010 |
| CN | 103069255 | 4/2013 |

(Continued)

*Primary Examiner* — Giovanni Astacio-Oquendo
*Assistant Examiner* — Raul J Rios Russo
(74) *Attorney, Agent, or Firm* — Lipsitz & McAllister, LLC

(57) ABSTRACT

A magnetostrictive displacement measuring apparatus is proposed, comprising at least one measuring probe which is of flexurally flexible configuration and comprises a waveguide, and comprising a magnetic position marker which couples to the at least one measuring probe in a non-contact manner, wherein the waveguide is supported in an elastic, flexible support tube and the flexible support tube is positioned in a carrier tube, wherein the flexible support tube is, on an outer side thereof, provided with indentations facing the carrier tube and wherein material of the carrier tube is arranged in the indentations.

17 Claims, 6 Drawing Sheets

(51) Int. Cl.
   *G01B 7/00*     (2006.01)
   *G01D 5/12*     (2006.01)
   *G01B 11/26*    (2006.01)
   *G01R 33/07*        (2006.01)
   *G01R 33/00*        (2006.01)

(56) References Cited

U.S. PATENT DOCUMENTS

| | | | |
|---|---|---|---|
| 5,050,430 | A | 9/1991 | Begin et al. |
| 5,747,986 | A | 5/1998 | Hristoforou |
| 6,185,155 | B1 | 2/2001 | Steinich |
| 6,559,636 | B1 | 5/2003 | Brunsch et al. |
| 7,965,073 | B2 | 6/2011 | Steinich |
| 9,182,213 | B2 | 11/2015 | Zern et al. |
| 2001/0017539 | A1 | 8/2001 | Brunsch et al. |
| 2005/0132807 | A1 | 6/2005 | Steinich |
| 2007/0188162 | A1* | 8/2007 | Steinich ................ G01D 5/485 324/207.11 |
| 2008/0150520 | A1 | 6/2008 | Steinich |
| 2010/0219812 | A1* | 9/2010 | Barr ...................... G01B 17/00 324/207.13 |
| 2013/0181700 | A1* | 7/2013 | Zern ..................... G01B 7/023 324/207.17 |

FOREIGN PATENT DOCUMENTS

| | | |
|---|---|---|
| DE | 19753805 | 6/1999 |
| DE | 10201880 | 7/2003 |
| DE | 102004062968 | 7/2006 |
| DE | 102005039661 | 3/2007 |
| DE | 102013009221 | 12/2014 |
| EP | 1306650 | 5/2003 |
| WO | 2012019927 | 2/2012 |
| WO | 2016128021 | 8/2016 |

* cited by examiner

MAGNETOSTRICTIVE PATH MEASURING APPARATUS AND METHOD OF MANUFACTURING A MEASURING PROBE OF A MAGNETOSTRICTIVE PATH MEASURING APPARATUS

This application claims the benefit of German application number 10 2016 114 561.0 filed on Aug. 5, 2016, which is incorporated herein by reference in its entirety and for all purposes.

BACKGROUND OF THE INVENTION

The invention relates to a magnetostrictive path measuring apparatus, comprising at least one measuring probe which is of flexurally flexible configuration and comprises a waveguide, and comprising a magnetic position marker which couples to the at least one measuring probe in a non-contact manner, wherein the waveguide is supported in an elastic, flexible support tube and the flexible support tube is positioned in a carrier tube.

The invention further relates to a method of manufacturing a measuring probe of a magnetostrictive path measuring apparatus, wherein the measuring probe is of flexurally flexible configuration and comprises a waveguide, a flexible support tube in which the waveguide is arranged and a carrier tube in which the flexible support tube is arranged.

DE 10 2013 009 221 A1 discloses an apparatus for magnetostrictive position measurement comprising a flexible tube made of a silicone material and in which a magnetostrictive waveguide extending in a longitudinal direction of the flexible tube is centrally guided by use of a guide device.

DE 102 01 880 A1 discloses a magnetostrictive sensor element.

U.S. Pat. No. 6,559,636 B1 discloses a modular waveguide assembly.

US 2005/0132807 A1 discloses a position sensor which works on the time-of-travel principle.

The international patent application PCT/EP2015/052643, of Feb. 9, 2015, not pre-published, describes a magnetostrictive path measuring apparatus comprising at least one measuring probe of flexurally flexible configuration. A magnetic position marker is provided which couples to the at least one measuring probe in a non-contact manner. The at least one measuring probe comprises a waveguide and a return conductor, wherein the waveguide is supported in an elastic, flexible support tube and the return conductor is arranged in a wall of the flexible support tube or in a wall of a carrier tube in which the flexible support tube is positioned.

SUMMARY OF THE INVENTION

In accordance with an exemplary embodiment of the invention, a magnetostrictive path measuring apparatus is provided which is easy to manufacture and allows safe operation with flexurally flexible configuration of the measuring probe.

In accordance with an exemplary embodiment of the invention, the magnetostrictive path measuring apparatus comprises a flexible support tube (sleeve) which is, on an outer side thereof, provided with indentations facing a carrier tube and wherein material of the carrier tube is arranged in the indentations.

By way of the indentations formed on the flexible support tube, an intimate connection between the carrier tube and the flexible support tube can be achieved. The carrier tube can, in a sense, be interlocked with the flexible support tube. An interlocking connection is provided in the form of a form-locking connection.

The carrier tube cannot then become detached from the flexible support tube even when the measuring probe is bent.

It is thereby possible for the waveguide to be arranged in the neutral fibre of the measuring probe. The waveguide will experience no torsion and also no longitudinal displacement, even when the measuring probe is bent.

The waveguide is prevented from buckling when the measuring probe is bent. It is thereby possible, for example, for a damper to be fixedly positioned at an end of the waveguide.

It is, for example, possible for the measuring probe to be bent for purposes of storage or transportation or also to be wound into roll form with an appropriate radius. This in turn provides for ease of storage and transportation of a measuring probe of correspondingly long measuring length (which may, for example, be on the order of magnitude of 20 m). The required measuring accuracy will still be achieved when in use, and a mechanically stable measuring probe is provided.

The interlocking connection between the flexible support tube and the carrier tube can be easily obtained through, for example, a pultrusion method.

In a magnetostrictive path measuring apparatus, an excitation current pulse originating from a measurement interface triggers a measurement. The excitation current pulse in turn is triggered by way of a start signal which is provided by the measurement interface. The excitation current pulse generates on the waveguide a circular magnetic field which, by virtue of the magnetically soft properties of the waveguide, is bundled therein. At a measuring point where the magnetic position marker is positioned, magnetic field lines of the position marker run orthogonally with respect to the circular magnetic field and are bundled in the waveguide. In this area, where the magnetic fields interact with each other, elastic deformation occurs in the micro-range of the structure of the waveguide as a result of magnetostriction.

This elastic deformation gives rise to an elastic wave that propagates along the waveguide. A returning transonic wave gives rise to an electrical signal in a pickup coil as a result of a reversal of the magnetostrictive effect and magnetic induction. The wave travel time is proportional to the distance between the position marker and the pickup coil. The distance between the pickup coil and the position marker can be determined with high accuracy by making a time measurement. The position of the position marker at the measuring probe can thereby be determined with high accuracy. The primary measuring signal for the time measurement is the excitation current pulse on the waveguide or the start signal that has launched the excitation current pulse, and the reaction pulse to the excitation current pulse which is supplied by the pickup coil with a time delay depending on the position of the position marker.

It is advantageous for the material of the carrier tube to fill up the indentations completely. Intimate interlocking between the carrier tube and the flexible support tube is thereby achieved.

It is particularly advantageous for the carrier tube to be connected to the flexible support tube by form-locking via material of the carrier tube in the indentations of the flexible support tube and, in particular, to be additionally connected thereto by substance-to-substance bonding. The intimate connection between carrier tube and flexible support tube is thereby preserved even when the measuring probe is bent. This in turn minimizes the torsional loading of the waveguide.

It is advantageous for the carrier tube to be made of a fibre composite material, in particular wherein fibres of the fibre composite material are glass fibres. This affords a simple way of providing a flexurally flexible carrier tube and hence a flexurally flexible measuring probe.

In particular, fibres are oriented (at least approximately) along a longitudinal axis of the carrier tube. This makes for a stable configuration. It is possible for all or only part of the fibres to be thus oriented. In particular, a greater proportion of fibres (more than 60%) is thus oriented.

It is particularly advantageous for the fibres in the fibre composite material to be arranged in strands of fibre. This results in ease of manufacturability. Strands of fibre are provided in the form of rovings for example.

It is advantageous for the flexible support tube to be made of an electrically insulating material and, in particular, to be made of a silicone material. This results in advantageous electrical properties with optimized support of the waveguide in the neutral fibre.

The at least one measuring probe comprises an electrical return conductor which is embedded in the flexible support tube and/or is embedded in the carrier tube and/or is arranged between the flexible support tube and the carrier tube (and, in the latter instance, is partially surrounded by material of the flexible support tube and is partially surrounded by material of the carrier tube). In particular, the return conductor is eccentrically arranged in relation to the waveguide. This provides a simple way for the waveguide to be supported in the neutral fibre.

In an embodiment, the return conductor comprises an electrical insulation sheath. Said electrical insulation sheath may, for example, be a silicone sheath or a varnish sheath. This provides a simple way for the return conductor to be exposed or "retrieved" during the manufacturing process in order to enable an electrical connection to be realized.

It is particularly advantageous for the waveguide to be arranged co-centrically with respect to the flexible support tube, wherein the return conductor is eccentrically arranged relative to the flexible support tube. It is thereby possible for a torsional loading of the waveguide to be minimized.

It is further advantageous for the carrier tube to surround the flexible support tube completely with respect to a circumferential direction. It is thereby possible for a torsional loading of the waveguide to be minimized.

It is advantageous if the waveguide is arranged co-centrically with respect to the carrier tube and, in particular, if the least one measuring probe is of rotationally symmetric configuration relative to the waveguide with respect to a longitudinal axis. This provides a simple way for the waveguide to be supported in a neutral fibre, and the torsional loads placed on the waveguide can be minimized.

The indentations are arranged along a longitudinal axis of the flexible support tube. It is then advantageous for the indentations on the flexible support tube to be arranged regularly in said longitudinal axis and, in particular, to have a uniform length along the longitudinal axis and/or a uniform spacing along the longitudinal axis. This results in ease of manufacturability and uniform load distribution over the length of the flexible support tube or the carrier tube.

It is possible for indentations on the flexible support tube to be formed completely or partially around the circumference of the flexible support tube with respect to a circumferential direction. A partially surrounding arrangement in particular, for example wherein diametrically opposed indentations are provided, can be easily manufactured.

In an exemplary embodiment, the indentations on the flexible support tube are formed by the latter being mechanically acted upon by an embossing tool and, in particular, by way of a roller and/or a roll. This affords a simple way of producing on the flexible support tube indentations that are arranged in a regular structure in particular.

It is particularly advantageous for material of the carrier tube that is placed in the indentations to be integrally connected to the remainder of the material of the carrier tube. This results in an intimate interlocking (advantageously with additional substance-to-substance bonding) between the carrier tube and the flexible support tube.

It is advantageous for the flexible support tube to be connected to the carrier tube via a pultrusion method. The pultrusion method permits, for example through the use of strands of fibre and a resin material, the fabrication of a fibre composite carrier tube onto the flexible support tube, wherein an intimate interlocking action with the flexible support tube is achieved.

In accordance with an exemplary embodiment of the invention, a method is provided in which the flexible support tube is, on an outer side thereof, provided with indentations and the carrier tube is fabricated onto the flexible support tube such that material of the carrier tube is placed in the indentations and a form-locking connection between the flexible support tube and the carrier tube is established.

The method in accordance with the invention has the advantages that have already been explained in the context of the apparatus constructed in accordance with the invention.

Further advantageous embodiments of the method in accordance with the invention have already been explained in the context of the apparatus constructed in accordance with the invention.

In particular, the apparatus constructed in accordance with the invention can be manufactured by way of the method in accordance with the invention.

It is advantageous for the connection between the flexible support tube and the carrier tube to be established such that it is also a substance-to-substance-bonded connection. An intimate connection of the carrier tube with the flexible support tube is thereby obtained in addition to the form-locking connection.

The indentations on the flexible support tube are produced in particular by a mechanical working operation and in particular by a mechanical embossing operation and in particular by use of a roller and/or a roll. This provides a way for the flexible support tube to be correspondingly worked upon for fabricating the indentations in an integral process in particular and with relatively small expenditure from a manufacturing standpoint.

In particular, the mechanical working operation for fabricating the indentations is carried out while heat is applied to the flexible support tube in order correspondingly to enable simple fabrication of indentations.

It is particularly advantageous for the carrier tube to be made of a fibre composite material that comprises glass fibres in particular. This makes for a stable configuration of the carrier tube (as a protective sheath for the waveguide) with formation of a bending capability.

In an embodiment, a plurality of fibre strands that are or will be impregnated with a resin are fed to a shaping tool which also has fed thereto the flexible support tube provided with indentations. It is thereby possible for the carrier tube be fabricated onto the flexible support tube with an intimate connection between the flexible support tube and the carrier tube. In particular, a pultrusion method is performed.

It is then advantageous for the shaping tool to comprise a central opening for the flexible support tube and a plurality of openings for fibre strands, said openings being distributed about the central opening. It is thereby possible for resin-impregnated fibre strands to be, in a sense, placed onto the flexible support tube, wherein a kind of extrusion process can additionally be performed in order to enable an intimate connection while fabricating a carrier tube, in particular a carrier tube having rotational symmetry (on its outer side).

In an embodiment, the shaping tool also has an opening for an electrical return conductor. It is thereby possible for an electrical return conductor also to be passed through the shaping tool, and this electrical return conductor can then be integrated in the sheathing or between the flexible support tube and the sheathing concurrently with the fabrication of the combination of flexible support tube and sheathing.

In particular, a fabricated strand of flexible support tube and sheathing is subjected to a resin curing process, in particular wherein the strand is drawn by a pulling tool. In principle, it is thereby possible to produce a continuous strand which may then be wound into a roll. By way of the resin curing process, the carrier tube is produced while at the same time an intimate interlocking action between the carrier tube and the flexible support tube is achieved.

It is in principle possible for an electrical return conductor for the waveguide to be fed to the shaping tool, wherein the return conductor is embedded into the carrier tube and/or positioned between the flexible support tube and the carrier tube. A return conductor can thereby be integrated concurrently with the fabrication of the sheathing of the flexible support tube.

Alternatively, it may be provided that an electrical return conductor is embedded in the flexible support tube or will be embedded therein. The corresponding flexible support tube with embedded return conductor is fed to the shaping tool.

It is advantageous if an electrical return conductor for the waveguide is or will be provided with an electrically insulating sheathing. A measuring probe can then be provided in roll form. For electrical contacting purposes, the corresponding electrically conductive part of the return conductor (in particular a copper wire) can then be "retrieved" in order to effect electrical connection.

In particular, following the manufacture of a combination of flexible support tube and carrier-tube sheathing, the waveguide is pulled into the flexible support tube. In principle, a measuring probe or measuring probe precursor is thereby produced which can be stored in roll form for example.

The following description of preferred embodiments serves to explain the invention in greater detail in conjunction with the drawings.

DETAILED DESCRIPTION OF THE INVENTION

Figure 1:
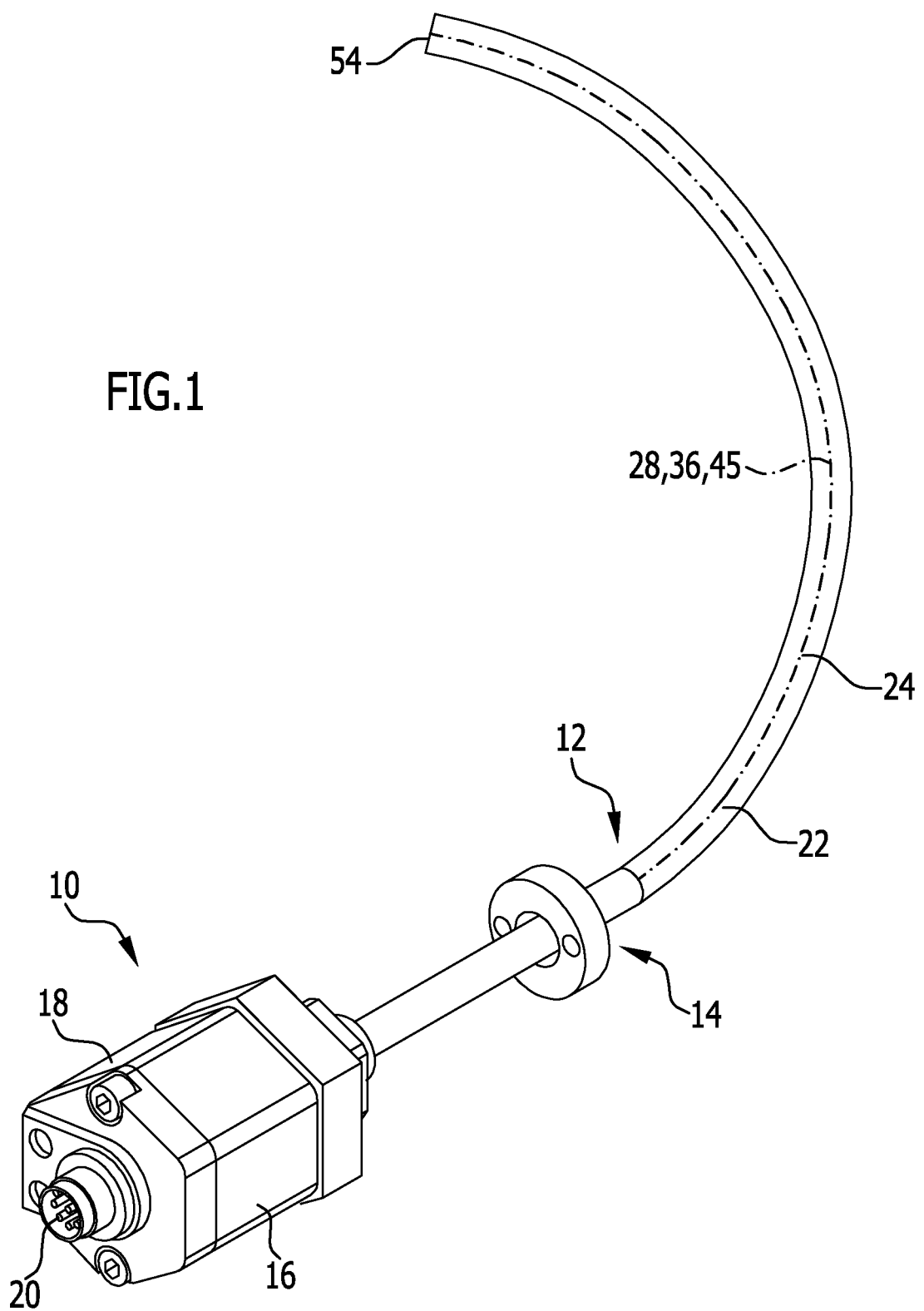
FIG. 1 is a schematic representation of an exemplary embodiment of a path measuring apparatus constructed in accordance with the invention.

An exemplary embodiment of a magnetostrictive path measuring apparatus constructed in accordance with the invention, shown in FIG. 1 and designated therein by 10, comprises a path transducer (path sensor) 12, a magnetic position marker 14 and a measurement interface 16. The measurement interface 16 is arranged in a housing 18. The housing 18 comprises a connector 20, in particular a plug connector 20, via which the measurement interface 16 can be supplied with electrical energy and via which data, and in particular positional data relating to the position of the position marker 14 on the path transducer 12, can be provided.

The measurement interface 16 comprises, in particular, a control device for the path transducer 12 and an evaluation device.

The path transducer 12 is configured as a magnetostrictive path transducer. It is configured with a measuring probe 22. A measuring path 24 is defined via the measuring probe 22. The measuring probe 22 is held on the housing 18.

Figure 2:
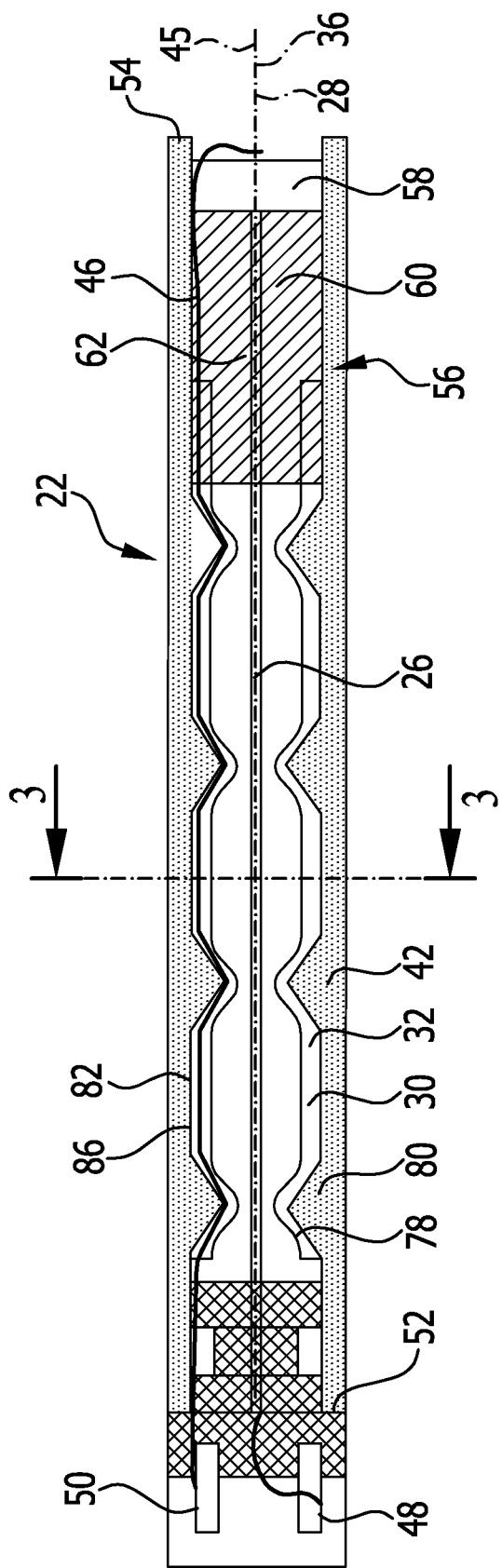
FIG. 2 is a schematic representation of a sectional view of a measuring probe of the path measuring apparatus in accordance with FIG. 1, with the measuring probe shown shortened and in a non-bent position.
Figure 3:
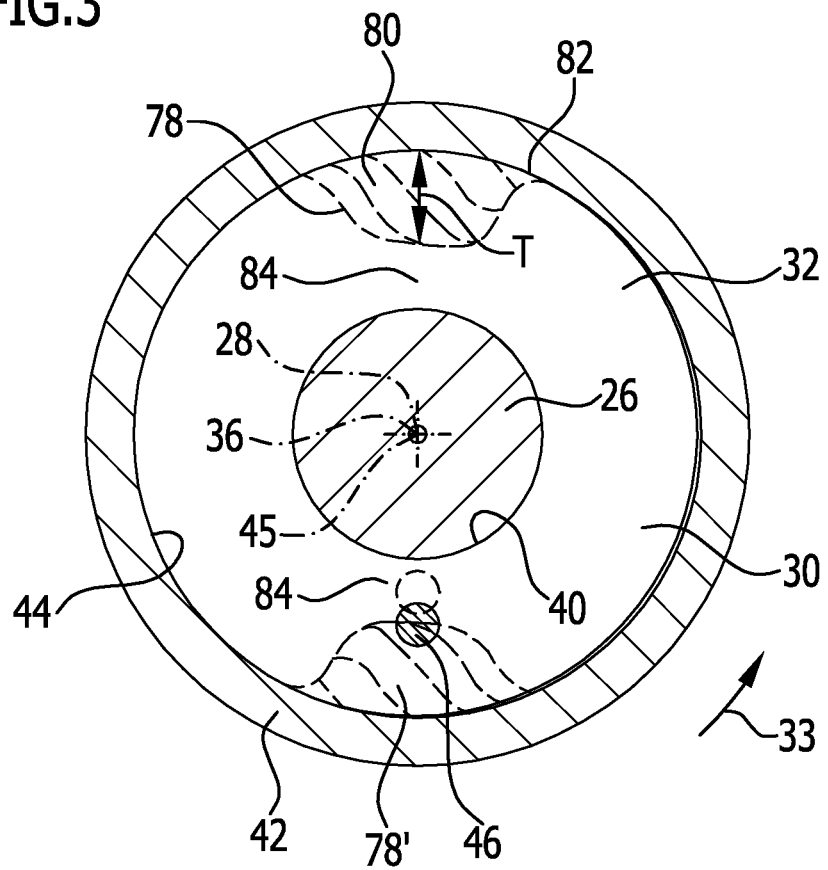
FIG. 3 is a sectional view along line 3-3 of FIG. 2.

The measuring probe 22 is of flexurally flexible configuration. It comprises a waveguide 26 (FIGS. 2 and 3). The waveguide 26 is a wire waveguide in particular. In a measuring operation, the waveguide 26 extends in a longitudinal axis 28 and defines a measuring range.

The waveguide 26 is arranged in a flexible support tube 30 made of an elastic material. The flexible support tube 30 is made of an electrically insulating material. By way of example, it is made of a silicone material.

The flexible support tube 30 comprises a wall 32 which, in cross-section (cf. FIG. 3), encompasses the waveguide 26 in a circumferential direction 33.

In particular, the waveguide 26 is of rotationally symmetric configuration with respect to the longitudinal axis 28. The flexible support tube 30 has a longitudinal axis 36. The longitudinal axis 28 and the longitudinal axis 36 coincide, i.e. the flexible support tube 30 is arranged co-centrically with respect to the waveguide 26.

The waveguide 26 is arranged in an interior 40 of the flexible support tube 30 which is surrounded by the wall 32.

The combination of waveguide 26 and flexible support tube 30 is arranged in a carrier tube 42 having a wall 43. The carrier tube 42 is of flexurally flexible configuration. The carrier tube 42 (i.e. the wall 43 thereof) is made of a fibre composite material which is, in particular, electrically insulating. By way of example, it is made of a composite material containing glass fibres. In particular, the fibres are arranged in strands.

The carrier tube 42 has a longitudinal axis 45 along which it extends. Said longitudinal axis 45 coincides with the longitudinal axis 28. When the measuring probe 22 is in a straight orientation, the longitudinal axes 28, 45 (and 36) are straight. In a bent orientation, they are correspondingly curved.

The carrier tube 42 completely surrounds the flexible support tube 30 in the circumferential direction 33; the flexible support tube 30 is arranged in an interior 44 of the carrier tube 42.

The waveguide 26 has associated with it an electrical return conductor 46 in order to enable a closed electrical circuit to be provided.

The waveguide 26 is electrically connected to a first connector 48. The return conductor 46 is electrically connected to a second connector 50. The first connector 48 and the second connector 50 are arranged in the housing 18 or are arranged in the area of an end 52 of the carrier tube 42 that is located at or near the housing 18.

In the area of an end 54 of the measuring probe 22 that faces away from the end 52, the carrier tube 42 has a damper 56 fitted thereto. The damper 56 serves to dampen back-reflection waves.

The damper 56 comprises a metal element 58 such as a brass disk. The waveguide 26 is operatively connected for electrical communication with said metal element 58. Furthermore, the return conductor 46 is connected to said metal element 58.

The metal element 58 is, for example, positioned in the interior 44 of the carrier tube 42, at or near the end 54.

The damper 56 further comprises a mechanical dampening element 60 of an elastic material. Said mechanical dampening element 60 serves to dampen mechanical waves by elastic energy absorption.

The mechanical dampening element 60 is made, for example, of a silicone material.

The mechanical dampening element 60 is positioned at the metal element 58 in a manner such that it projects into the interior 44. A portion 62 of the waveguide 26 is routed through the mechanical dampening element 60 to the metal element 58.

The return conductor 46 is, for example, configured as a wire conductor. It is routed from the metal element 58 through the wall 32 of the flexible support tube 30 to the second connector 50. The return conductor 46 is arranged in the wall 32 of the elastic, flexible support tube 30. It is embedded in the wall 32 of the flexible support tube 30.

The return conductor 46 is positioned acentrically with respect to the longitudinal axis 28 of the waveguide 26 or the longitudinal axis 36 of the flexible support tube 30.

The return conductor 46 is located in the flexible support tube 30, between the waveguide 26 and the carrier tube 42. The flexible support tube 30 provides electrical isolation between the waveguide 26 and the return conductor 46 outside of the portion 62.

The return conductor 46 is positioned in the interior 44 of the carrier tube 42 both in spaced relation with respect to a wall of the carrier tube 42 and in spaced relation with respect to the waveguide 26.

In the portion 62, the mechanical dampening element 60, which is made of an electrically insulating material, provides electrical isolation between the waveguide 26 and the return conductor 46.

Figure 8:
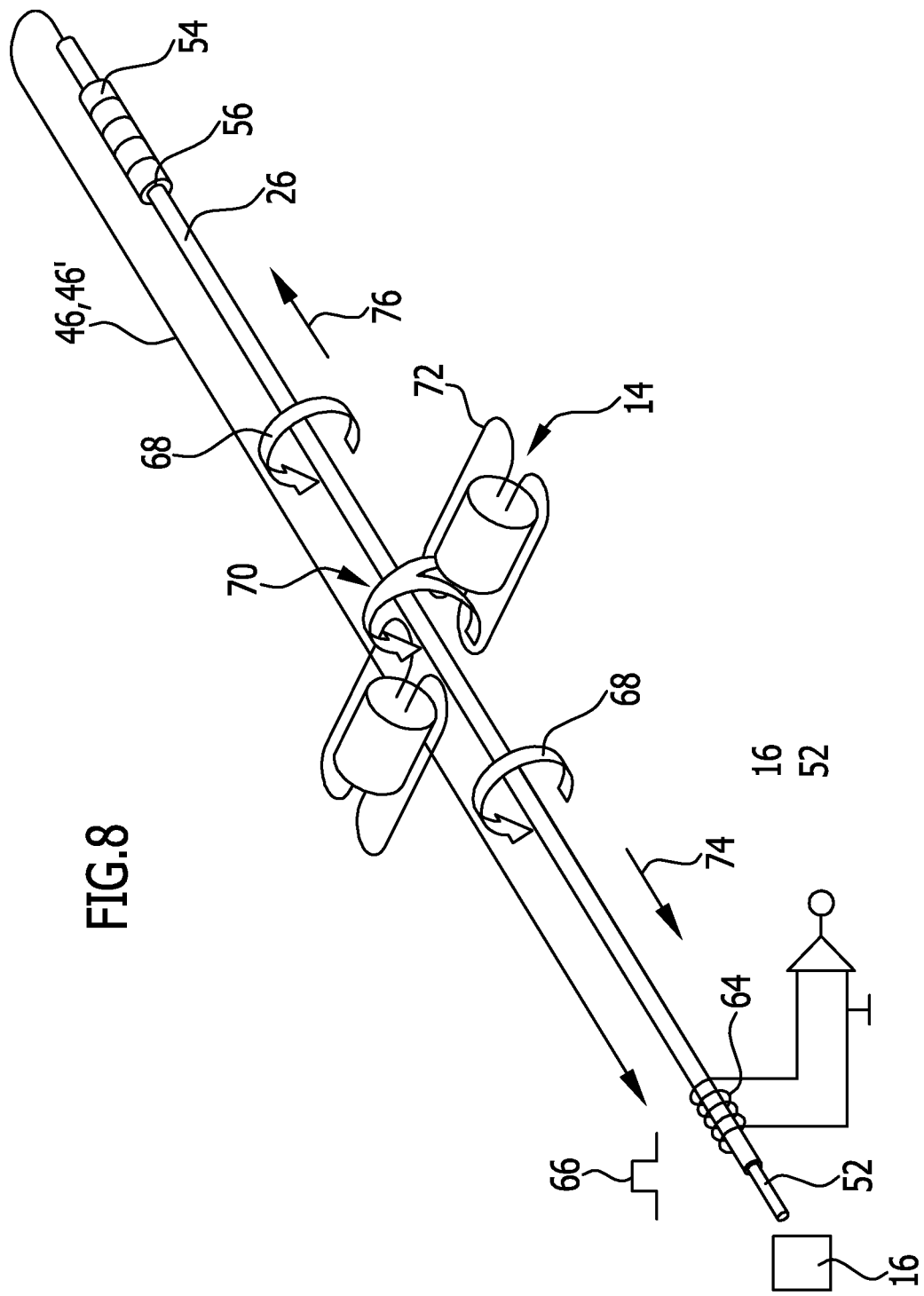
FIG. 8 is a schematic representation of a magnetostrictive path measuring apparatus for the purpose of explaining its principle of operation.

The measuring probe 22 comprises a signal converter device 64 which serves to generate an excitation current pulse 66 (FIG. 8). The signal converter device 64 comprises for example a pickup coil or a piezoelectric transducer.

The operating principle of the magnetostrictive path measuring apparatus 10 is described in a schematic manner by reference to FIG. 8:

The control device of the measurement interface 16 provides a start signal to the measuring probe 22. This causes an excitation current pulse 66 in the waveguide 26 to be triggered at the coil device 64. This in turn triggers a measurement.

The excitation current pulse 66 generates at the waveguide 26 a circular magnetic field 68 which, by virtue of the magnetically soft properties of the waveguide 26, is formed therein. The position marker 14 is positioned at a measuring point 70 of the waveguide 26. The magnetic field lines 72 of the position marker 14 are orthogonal to the circular magnetic field 68 and are also formed in the waveguide 26.

In an area where the circular magnetic field 68 and the magnetic field generated by the position marker 14 interact with each other, elastic deformation occurs in the microrange of the structure of the waveguide 26 as a result of magnetostriction. This elastic deformation gives rise to a mechanical wave (an elastic wave) that propagates along the waveguide 26 in opposite directions 74, 76. The propagation speed of that wave within the waveguide 26 is in particular on the order of magnitude of approximately 2800 m/s and is largely immune to environmental influences.

The damper 56 is arranged at the end 54 of the waveguide 26. By virtue of said damper 56, the transonic wave running towards the end 54 is dampened so that an amplitude of the component of the wave that is back-reflected at the end 54 is reduced and is in particular considerably reduced at the time of signal detection, when compared with the amplitude of the wave that propagates directly (in the direction 74).

The pickup coil of the coil device 64, by reversing the magnetostrictive effect and magnetic induction, generates an electrical signal which is supplied to the measurement interface 16 and is evaluated in the evaluation device.

The time it takes the wave to travel from its place of origin 70 to the pickup coil of the coil device 64 is directly proportional to the distance between the position marker 14 and the pickup coil. The distance between the pickup coil and the position marker 14 at the measuring point 70 can therefore be accurately determined by making a time measurement. The primary measuring signal for the time measurement is the electrical signal of the pickup coil which is supplied from the pickup coil to the measurement interface 16 with a time delay relative to the start signal (which has launched an excitation current pulse 66) depending on the distance between the pickup coil and the position marker 14.

The carrier tube 42 is connected to the flexible support tube 30 in a form-locking manner and preferably also with a substance-to-substance bond. To this end, the flexible support tube 30 has formed therein a plurality of indentations 78 which are filled with material 80 of the carrier tube 42.

The indentations 78 are fabricated prior to ensheathing the flexible support tube 30, in particular by performing a mechanical working operation thereon using an embossing tool. This will be explained in greater detail hereinbelow.

The flexible support tube 30 has a surface envelope 82 which is cylindrical. The indentations 78 are, with respect to this surface envelope 82, depressions or "dents" formed in the flexible support tube 30, wherein said depressions face towards the carrier tube 42. The indentations 78 have a depth T relative to the surface envelope 82 of the flexible support tube 30 (cf. FIG. 3) which is smaller than a distance between the surface envelope 82 and the interior 40 which receives the waveguide 26. Thus, the indentations 78 do not extend as far as the interior 40. Located between an indentation 78 and the interior 40 is a material region 84 of material of the flexible support tube 30.

A plurality of indentations 78 are arranged in spaced relation relative to each other along the longitudinal axis 36 of the flexible support tube 30. Located between adjacent indentations 78 is a material region 86 of the flexible support tube 30 which extends as far as the surface envelope 82.

Preferably, the indentations 78 along the longitudinal axis 36 are of substantially identical configuration and have a uniform length. Furthermore, a distance between adjacent indentations 78 is preferably constant.

A typical order of magnitude for a length of an indentation 78 along the longitudinal axis 36 of the flexible support tube 30 is in the millimeter range. A typical order of magnitude for the depth T is in the millimeter range.

It is in principle possible for an indentation 78 to extend all the way around the circumference of the flexible support tube 30 in the circumferential direction 33.

In an exemplary embodiment, the indentations 78 do not go completely around (cf. FIG. 3). It is in principle possible for only one indentation 78 or for a plurality of indentations 78 to be provided relative to the circumferential direction 33 in a corresponding cross-sectional area. In the exemplary embodiment depicted in FIGS. 2 and 3, two indentations 78, 78', spaced apart from each other in circumferential direction 33, are provided relative to a cross-sectional area.

In particular, the indentations 78, 78' are arranged in diametrically opposed relation to each other relative to a corresponding cross-sectional area (perpendicular to the longitudinal axis 36 of the flexible support tube 30). This enables easy manufacturability by, for example, embossing rolls that are positioned in opposed relationship to each other. This will be explained in greater detail hereinbelow.

When the return conductor 46 is embedded in the flexible support tube 30, then it is ensured that, when the indentations 78 are fabricated, the return conductor 46 is embedded in the material of the flexible support tube 30 also in the area of indentations 78, i.e. that it is located within the material region 84 in the area of indentations 78.

The carrier tube 42 is made of a fibre composite material, wherein the carrier tube 42 is fabricated onto the flexible support tube 30 including its indentations 78, as will be explained in greater detail hereinbelow. During the fabrication, the material 80 of the carrier tube 42 penetrates the corresponding indentations 78 and fills them up. An interlocking effect between the carrier tube 42 and the flexible support tube 30 is thereby created. Said interlocking connection provides a form-locking connection between the flexible support tube 30 and the carrier tube 42, wherein a substance-to-substance-bonded connection is additionally created between the material of the carrier tube 42 and the material of the flexible support tube 30.

A non-removable connection between the carrier tube 42 and the flexible support tube 30 is thereby produced. The carrier tube 42 cannot be stripped off the flexible support tube 30.

In this way, a non-separable connection between the flexible support tube 30 and the carrier tube 42 is provided even when the measuring probe 22 is bent.

Figure 4:
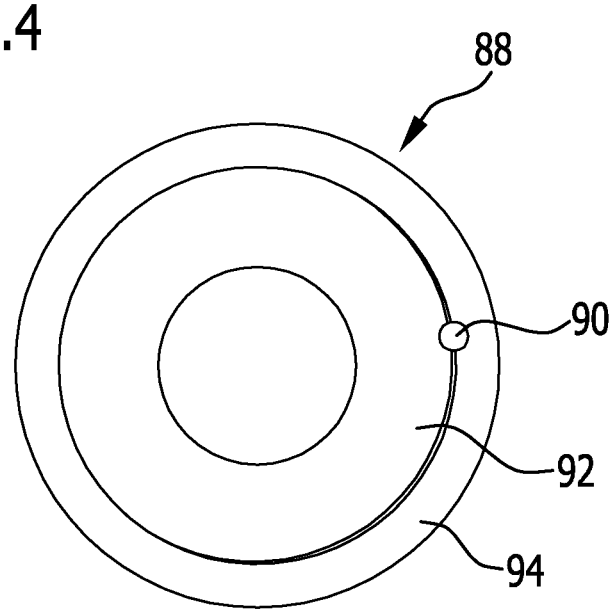
FIG. 4 illustrates a variant form, showing a different arrangement of a return conductor.

In an alternative embodiment of a measuring probe which is shown in cross-section in FIG. 4 and indicated therein by 88, a return conductor 90 is arranged between a flexible support tube 92 and a carrier tube 94. Part of the return conductor 90 is surrounded by material of the flexible support tube 92 and the remainder of the return conductor 90 is surrounded by material of the carrier tube 94.

The flexible support tube 92 and the carrier tube 94 are, in principle, configured in the same manner as described above (in particular with indentations 78).

Figure 5:
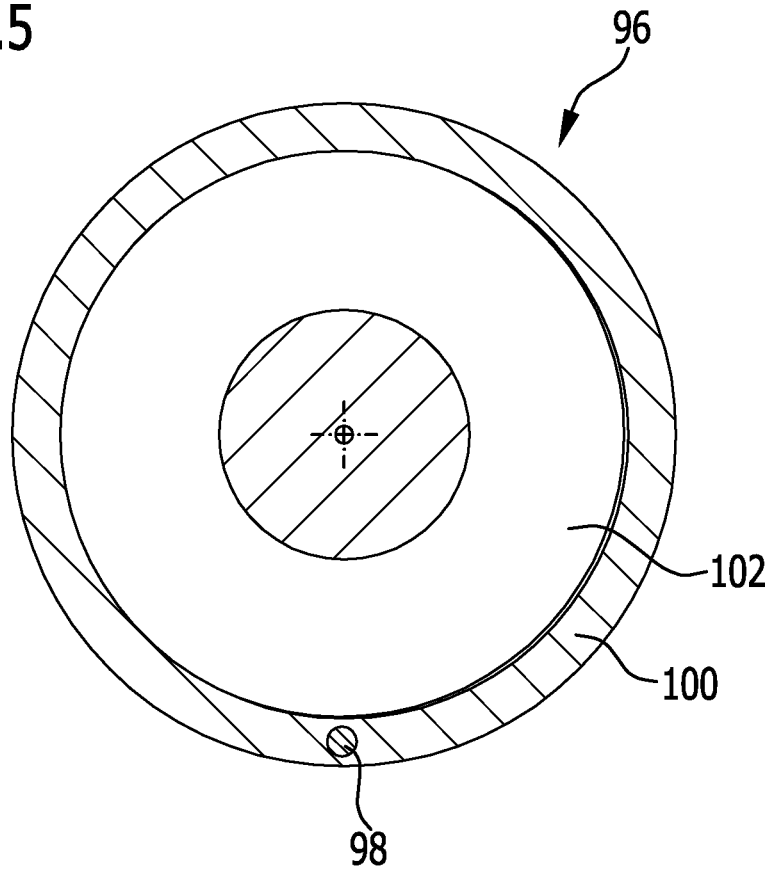
FIG. 5 shows a further variant form of an arrangement of an electrical return conductor.

In a further alternative embodiment (FIG. 5), a corresponding measuring probe 96 comprises a return conductor 98 which is embedded in a carrier tube 100. The return conductor 98 is completely surrounded by material of the carrier tube 100. A corresponding flexible support tube 102 is, in principle, configured in the same manner as described above. It comprises indentations 78 in particular.

The embodiments using the arrangement of the return conductor 46 (embedded in the flexible support tube 30 and completely surrounded by material of the flexible support tube 30), the return conductor 90 (arranged between the flexible support tube 92 and the carrier tube 94 and partially surrounded by material of the flexible support tube 92 and of the carrier tube 94) and of the return conductor 98 (embedded in the carrier tube 100 and completely surrounded by material of the carrier tube 100) can be alternative or cumulative embodiments. By way of example, it is possible for only a single return conductor 46, 90, 98 to be provided or for a plurality of return conductors (46 and/or 90 and/or 98) to be provided in different positions.

It is also possible, for example, that the return conductor 46, 90, 98 be formed by a wire, such as a copper wire, or to comprise a wire which is provided with an electrical insulation sheath, such as a varnish sheath or a silicone sheath. Such an embodiment provides a simple way for the corresponding return conductor to be exposed at a later time. When the corresponding return conductor is provided with an electrically insulating sheathing, it can be readily "retrieved" following manufacture of the corresponding combination of flexible support tube 30 and carrier tube 42 in order to provide a simple way of making the electrical connection.

Figure 7:
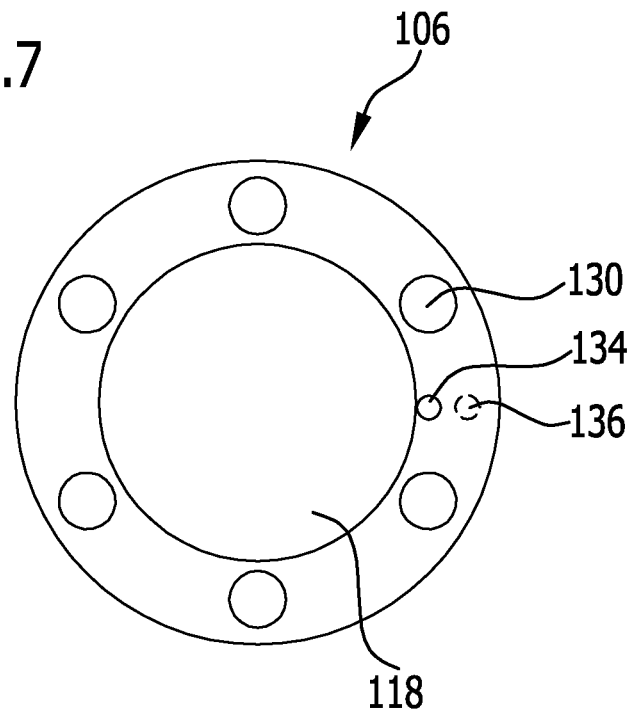
FIG. 7 is a schematic top view of a shaping tool of FIG. 6, in the direction A.
Figure 6:
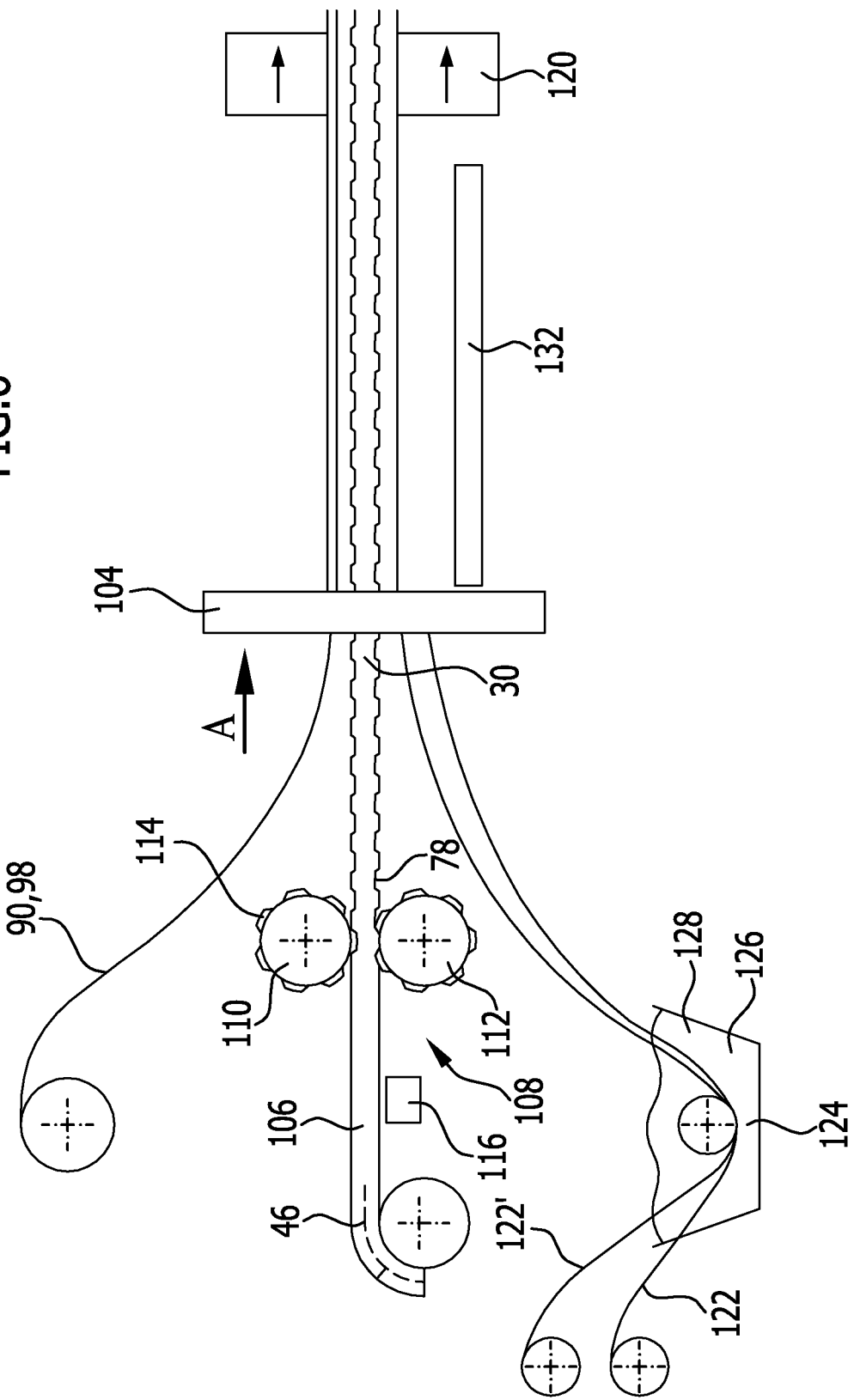
FIG. 6 is a schematic representation of an apparatus for manufacturing a combination of a flexible support tube and a carrier-tube sheathing.

In an embodiment, a pultrusion process is carried out to manufacture a measuring probe 22 (FIG. 6). A shaping tool 104 is provided (FIGS. 6 and 7). The flexible support tube 30 is fed to said shaping tool 104.

The flexible support tube 30 is fabricated from a precursor 106. The precursor 106 has not yet been provided with indentations 78 and is for example provided in roll form.

In the embodiment in which the return conductor 46 is embedded in the flexible support tube 30, the precursor 106 has already been correspondingly provided with said return conductor 46.

The precursor 106 is fed to an embossing tool 108 which embosses the indentations 78.

In an embodiment, the embossing tool 108 comprises at least one roller or roll 110, preferably a first roll 110 and a second roll 112, between which the precursor 106 is passed. The first roll 110 and the second roll 112 are provided with corresponding embossing projections 114. These form a positive form for the indentations 78, 78'.

Preferably, the first roll 110 and the second roll 112 are synchronized with each other and oriented such that corresponding embossing projections 114 act in diametrically opposed relation with respect to one another. In this way, one of the rolls 110 and 112 can form an anvil roll for the other one of the rolls 112 and 110.

Preferably, provision is made for the precursor 106 to be heated by a heating device 116 prior to manufacturing the indentations 78.

It is in principle possible for the first roll 110 and/or the second roll 112 to be additionally or alternatively heated.

The flexible support tube 30 thus produced is then passed through a central opening 118 of the shaping tool 104.

A pulling tool 120 is coupled to the flexible support tube 30 in such a manner that the latter (along with fibre strands 122) is drawn through the corresponding apparatus and in particular through the central opening 118 of the shaping tool 104 and is in particular drawn therethrough in a continuous process.

In principle, it is then possible for a corresponding combination of flexible support tube 30 and carrier tube 42 to be, again, provided in roll form.

Alternatively, provision is made for cutting to be practiced only downstream of the pulling tool 120.

To manufacture the carrier tube 42, fibres are used which are, in particular, provided in the form of strands (rovings) 122. Fibre strands 122 are provided in roll form in particular.

The shaping tool 104 is provided with a plurality of fibre strands 122, 122' etc.

An impregnation device 124 is provided where the fibre strands 122, 122' etc. undergo impregnation with a resin.

In an exemplary embodiment, the impregnation device 124 comprises one or more troughs 126 which are filled with resin 128. In addition, the trough 126 or troughs 126 can contain filler material mixed with the resin. It is also possible, for example, for a release agent to be contained in such a trough 126, which release agent ensures that the risk of adhesion to the shaping tool 104 is minimized.

The fibre strands 122, 122' etc. are passed through the contents of the troughs 126 and are then fed to the shaping tool 104.

To this end, the shaping tool 104 comprises a plurality of openings 130, wherein such openings 130 are distributed, and are in particular uniformly distributed, about a central opening 118. A respective strand of fibre 122 is fed to and passed through such an opening 130.

The shaping tool 104 also comprises a "placement function" via which "placement" of the impregnated fibre strands 122, 122' etc. onto the flexible support tube 30 occurs. The shaping tool 104 is configured such that an extruder function exists in order to produce an intimate connection between the flexible support tube 30 and the sheathing, which latter will then form the carrier tube 42, and also, in particular, in order to enable filling up the indentations 78.

The corresponding method is in particular a pultrusion process in which pultruding the strand of flexible support tube and sheathing (including embedded strands of fibre) is realized by way of the pulling tool 120 and a kind of extrusion is realized in the shaping tool 104.

Arranged downstream of the shaping tool 104 is a curing device 132 where curing of the resin is realized. By way of example, the resin is cured at the curing device 132 by a corresponding application of heat. A typical order of magnitude for a corresponding temperature is approximately 150° C.

The intimate bond between the sheathing and the flexible support tube 102 is thereby created, thereby creating the form-locking and substance-to-substance-bonded connection between the carrier tube 42 and the flexible support tube 30.

It is in principle possible for the fibre strands 122, 122' etc. to follow the course of the flexible support tube 30, including the indentations 78.

In the exemplary embodiment described above, the return conductor 46 is already integrated in the precursor 106.

It is also possible for a return conductor 90 or 98 to be introduced into the combination of flexible support tube and sheathing via the shaping tool 104.

For example, the return conductor 90, 98 is provided in roll form. As described above, the return conductor 90, 98 is then for example a copper wire or a copper wire that is jacketed in electrically insulating sheathing.

In order to arrange the return conductor 90 between the flexible support tube 92 and the carrier tube 94, the shaping tool 104 comprises an opening 134 which is arranged at the central opening 118 in order to allow the return conductor 90 to be correspondingly positioned between the flexible support tube 92 and the carrier tube 94.

In order to position the return conductor 98, the shaping tool 104 comprises an opening 136 which is arranged in such a manner that the corresponding return conductor 98 is then embedded in the carrier tube 100.

Following the fabrication of the corresponding combination of flexible support tube 30 and carrier tube 42 (or flexible support tube 92 and carrier tube 94 or flexible support tube 102 and carrier tube 100), the waveguide 26 is pulled into the corresponding interior 40 of the flexible support tube 30 or 92 or 102 respectively.

In accordance with the invention, a measuring probe 22 is provided which has high bendability and can, in principle, be provided in roll form and also, in principle, in any desired lengths.

The waveguide 26 in this measuring probe 22 will not experience torsion when subjected to bending.

The measuring probe 22 is equally stable in all directions. It can thereby be bent relatively sharply without the risk of buckling. Bending causes no longitudinal displacement of an end region of the waveguide 26.

By way of the indentations 78 formed on the flexible support tube 30, a form-locking and preferably also a substance-to-substance-bonded connection results between the carrier tube 42 and the flexible support tube 30. This also ensures that the waveguide 26 in the measuring probe 22 is always in the neutral fibre and experiences no torsion.

REFERENCE SYMBOL LIST

10 path measuring apparatus
12 path transducer
14 position marker
16 measurement interface
18 housing
20 connector
22 measuring probe
24 measuring path
26 waveguide
28 longitudinal axis of waveguide 26
30 flexible support tube
32 wall
33 circumferential direction
36 longitudinal axis of flexible support tube 30
40 interior
42 carrier tube
43 wall
44 interior
45 longitudinal axis of carrier tube 42
46 return conductor
48 first connector
50 second connector
52 end
54 end
56 damper
58 metal element
60 mechanical damping element
62 portion of the waveguide 26
64 signal converter device
66 excitation current pulse
68 circular magnetic field
70 measuring point 72 magnetic field lines
74 direction
76 direction
78 indentation
78' indentation
80 material
82 surface envelope
84 material region
86 material region
88 measuring probe
90 return conductor
92 flexible support tube
94 carrier tube
96 measuring probe
98 return conductor
100 carrier tube
102 flexible support tube
104 shaping tool
106 precursor
108 embossing tool
110 first roll
112 second roll
114 embossing projection
116 heating device
118 central opening
120 pulling tool
122 strand of fibre
122' strand of fibre
124 impregnation device
126 trough
128 resin
130 opening
132 curing device
134 opening
136 opening

What is claimed is:

1. Magnetostrictive path measuring apparatus, comprising:
   at least one measuring probe which is of flexurally flexible configuration and comprises a waveguide; and
   a magnetic position marker which couples to the at least one measuring probe in a non-contact manner, wherein the waveguide is supported in an elastic, flexible support tube and the flexible support tube is positioned in a carrier tube;
   wherein the flexible support tube is, on an outer side thereof, provided with indentations facing the carrier tube and wherein material of the carrier tube is arranged in the indentations.

2. Path measuring apparatus in accordance with claim 1, wherein material of the carrier tube fills the indentations completely.

3. Path measuring apparatus in accordance with claim 1, wherein the carrier tube is connected to the flexible support tube by form-locking via material of the carrier tube in the indentations of the flexible support tube.

4. Path measuring apparatus in accordance with claim 1, wherein the carrier tube is made of a fibre composite material.

5. Path measuring apparatus in accordance with claim 4, wherein fibres of the fibre-reinforced composite material are oriented in a longitudinal axis of the carrier tube.

6. Path measuring apparatus in accordance with claim 4, wherein fibres in the fibre composite material are arranged in strands of fibre.

7. Path measuring apparatus in accordance with claim 1, wherein the flexible support tube is made of an electrically insulating material.

8. Path measuring apparatus in accordance with claim 1, wherein the at least one measuring probe comprises an electrical return conductor which is at least one of (i) embedded in the flexible support tube; (ii) embedded in the carrier tube; and (iii) arranged between the flexible support tube and the carrier tube.

9. Path measuring apparatus in accordance with claim 8, wherein the return conductor comprises an electrical insulation sheath.

10. Path measuring apparatus in accordance with claim 8, wherein the waveguide is arranged co-centrically with respect to the flexible support tube, wherein the return conductor is eccentrically arranged relative to the flexible support tube.

11. Path measuring apparatus in accordance with claim 1, wherein the carrier tube surrounds the flexible support tube completely with respect to a circumferential direction.

12. Path measuring apparatus in accordance with claim 1, wherein the waveguide is arranged co-centrically with respect to the carrier tube.

13. Path measuring apparatus in accordance with claim 1, wherein indentations on the flexible support tube are arranged regularly in a longitudinal axis of the flexible support tube.

14. Path measuring apparatus in accordance with claim 1, wherein indentations on the flexible support tube are formed completely or partially around the circumference of the flexible support tube with respect to a circumferential direction.

15. Path measuring apparatus in accordance claim 1, wherein the indentations on the flexible support tube are formed by the latter being mechanically acted upon by an embossing tool.

16. Path measuring apparatus in accordance with claim 1, wherein material of the carrier tube that is placed in the indentations is integrally connected to the remainder of the material of the carrier tube.

17. Path measuring apparatus in accordance with claim 1, wherein the flexible support tube is connected to the carrier tube via a pultrusion method.

* * * * *